United States Patent [19]

Thams

[11] Patent Number: 5,376,404
[45] Date of Patent: Dec. 27, 1994

[54] METHOD OF COATING RIDGED PLATES, PARTICULARLY PRINTED CIRCUIT BOARDS

[76] Inventor: Johan-Petter B. Thams, Gröviksvägen 69, S-161 40 Bromma, Sweden

[21] Appl. No.: 30,462

[22] Filed: Apr. 1, 1993

[30] Foreign Application Priority Data

Nov. 2, 1990 [SE] Sweden ............................... 9003504-9

[51] Int. Cl.$^5$ ............................................. C23C 26/00
[52] U.S. Cl. ........................................ 427/96; 427/428
[58] Field of Search ................................. 427/428, 96

[56] References Cited

U.S. PATENT DOCUMENTS

| 3,535,157 | 10/1970 | Steinhoff | 427/428 |
| 4,493,857 | 1/1985 | Knigge | 427/428 |
| 5,112,428 | 5/1992 | Correa | 427/9 |

FOREIGN PATENT DOCUMENTS 3006862  9/1981  Germany ............................... 427/428

OTHER PUBLICATIONS

Werner Peters, "Fostosensitive Lotstopplacke und ihre Applikationsverfahren", Oct. 1988, Speziallacke fur die Elektronik.

*Primary Examiner*—Shrive Beck
*Assistant Examiner*—Vi Duong Dang
*Attorney, Agent, or Firm*—Burns, Doane, Swecker & Mathis

[57] ABSTRACT

Method for applying liquid varnish coating over raised conductor pattern of a printed circuit board. The circuit board is passed through nip rolls at least one of which has a coating of liquid varnish thereon. The thickness of the coating on the nip roll is adjusted to between 5 and 100 μm by adjusting the thickness of liquid varnish on an applicator roll in contact with the nip roll. The flow of liquid varnish applied to the applicator roll is at least 1.5 times the rate of transfer from the nip rolls to the circuit board.

20 Claims, No Drawings

METHOD OF COATING RIDGED PLATES, PARTICULARLY PRINTED CIRCUIT BOARDS

This application is a continuation under 35 U.S.C. 371 of/EP 91/00737, filed Oct. 31, 1991.

The present invention relates to a method of applying to ridged plates, particularly printed circuit boards, a varnish coating, particularly a solder resist, which preferably consists of a light-sensitive, e.g. photopolymerizeable varnish or lacquer.

In order to protect the conductors on printed circuit boards from contact with solder when, for example, flow-soldering those components which must not come into contact with the solder, it is normal in the manufacture of such cards to coat these components with varnish while leaving those parts of the circuit which shall be soldered free from varnish.

Hitherto, this varnish (solder resist or solder mask) has been applied in patterns with the aid of conventional screen printing, although because the conductors on the circuit board have become finer and finer with progressively higher degrees of precision and accuracy with respect to holes and hole-collars, the circuit boards are now produced photographically, wherein the pattern is applied subsequent to coating with a light-sensitive film. The film as such can be dissolved in a developing liquid, although it hardens when exposed to light and the light-irradiated parts cannot be dissolved. It is possible, of course, to reason in the opposite direction, namely that a film which has been hardened by irradiation with light becomes soluble.

The film can be applied as a foil or as liquid varnish. This film, antisolder varnish film or solder resist, shall be applied so that no air is present between the substrate, the printed circuit board, and the film. When the film is applied in the form of a self-adhesive foil, the foil is normally applied with the aid of a press and under vacuum. It is, however, almost impossible to apply the film totally on the surfaces of the circuit board between conductors which lie closely together in a dense conductor pattern. If interspaces are present and air thus remains, the film lifts during the soldering process and ruptures.

Another possibility of applying a solder resist involves screen-printing the whole of the surface of the printed circuit board with a liquid varnish, such as to press the varnish down between the conductors. One drawback with this method is that the varnish is also pressed down into the component holes. Another problem resides in the difficulty of obtaining a sufficiently thick layer of varnish over the conductors, and also that different varnish thicknesses are obtained in the printing direction on conductors which extend perpendicularly to the printing direction.

Another known method of applying solder resists is to curtain-varnish the circuit boards with a very coating of varnish. The drawback with this method is that not all of the air is pressed away in the case of dense patterns, and that varnish enters the component holes. Another drawback is that the varnish can only be applied on one side at a time, and that the circuit board must be held completely flat until the varnish has set.

Also known to the art is a process in which varnish coating are applied with the aid of a roller coating technique when preparing solder masks (solder resists), in much the same manner as when preparing etching resists or masks. This process employs the use of embossed rolls, in order to ensure that sufficient varnish is taken up. However, it has only been possible to use this known process with conductors of small height extensions. Furthermore, only small coating thicknesses can be applied when practicing this known process and the process can therefore only be used effectively in some few cases. The process also requires the use of low-viscosity varnishes, which are associated with small varnish thicknesses and poor covering of the etched areas, The solder resist shall fulfill two functions. Firstly, it shall protect from contact with solder those free copper surfaces that are not to be soldered. Secondly, the solder resist shall also act as an insulator. Consequently, it is important that the varnish layer is applied to a sufficient thickness. The most serious problem is that of covering the edges of the conductors that have been etched out. When applied to an edge surface, the varnish will contract from the sharp corner(s) of this edge surface as a result of surface tension.

An object of the present invention is to eliminate the drawbacks of this known technique.

Another object of the invention is to provide a method which will enable a plate to be varnished readily and economically.

These objects are achieved with the present inventive method, in which a varnish coating is applied to a plate by passing the plate through a roll nip in a roll press for coating the plate on one or both sides thereof, and by supplying the varnish at a temperature of at least 5° C. and a viscosity of at least 300 mPa.s, and adjusting the thickness of the varnish film on respective applicator rolls to 5–100 μm, by adjustment in a known manner, e.g. by a pressure roll or doctor blade, for example.

A suitable thickness of the varnish film on the applicator roll is preferably at least 20 or 30 μm, example 40 μm, and at most 80 or 90 μm, for example 70 μm. The temperature of the varnish upon application is preferably at highest 60° C., preferably at least 15° to 20° C. It is primarily suitable to work at room temperature, e.g. 18°–24° C. The viscosity should not exceed 5000 mPa.s and preferably not 4000 mPa.s. A suitable viscosity lies in the range of 1000–3000 mPa.s.

The viscosity is thus the decisive parameter. The viscosity, however, is temperature dependent, although, of course, it is the viscosity of the varnish applied which is essentially decisive. The best results, however, are obtained with a "short" varnish. In other words, the varnish shall not form filaments. This property of varnishes is known, although no method of measuring this property (unit of measurement) has been proposed or established.

A double-sided coating machine may, for instance, include two bottom rolls and two top rolls arranged vertically above one another. The rolls axles are mounted horizontally and the distances between the rolls of each roll pair determines the thickness to which the varnish shall be applied to the plate (the panel). The size of the roll nip is determined by the material thickness of the plate.

In operation, the varnish is pumped continuously onto the applicator rolls through a perforated pipe for the upper roll pair and through a perforated pipe for the lower roll pair. A copious flow of varnish is necessary, since there should be maintained a continuous flow of varnish which runs along the rolls and, when reaching the end of the rolls, runs down into a container and is continuously pumped back onto the rolls. The amount of varnish delivered to the roll should correspond at least to 1.5 times the amount consumed by the coating, preferably at least 5, most preferably at least 10 times this amount. The amount of varnish supplied may be as high as from 25 to 30 times the amount consumed by the coating, and even higher, the higher limits of the amount delivered being limited by practical circumstances.

The plates can be placed in a rack, subsequent to having passed through the roll nip. The varnish is pressed down between the conductors already on the first pass through the nip. The viscosity of the varnish is so high that the varnish will not run, even though the plates are placed on edge. In order to apply a varnish layer of sufficient thickness, it may be necessary to apply a further coating of varnish to the plate, for example after 4 minutes.

The plates may also be allowed to pass automatically through a further varnish-applying machine, i.e. the plates are fed automatically into a first varnishing machine, passed over a conveyor belt, for example a so-called "hedgehog belt", dried for a couple of minutes so that the varnish or lacquer solidifies and are then fed automatically into a further varnishing machine and then dried to a non-tacky state for subsequent exposure.

The present invention affords a large number of advantages, namely a very uniform varnish layer, the absence of varnish in mounting holes, enables the plates to be varnished on both sides thereof, a high production rate, no contaminants collect in the varnish with continuous filtration, a thick varnish layer even over single conductors, the absence of air between closely packed conductors, no setting-up costs when varnishing different plates (printed circuit boards), no material waste.

Thus, the invention enables both sides of a plate to be coated simultaneously. It has earlier been possible to coat two sides of a plate by screen printing or curtain varnishing, in which first one side of the plate is coated and then the other side thereof. When practicing these methods, however, the sensitivity to light and the developing times of the varnish coatings vary on the two sides of the plate, since the sensitivity of the varnish and its hardening when irradiated with light are dependent on the length of time over which the varnish has been dry on the plate. A dry varnish hardens constantly at room temperature and even more so the higher the drying temperature. These difficulties have now been completely overcome. It must also be mentioned that screen-printing coating machines are known in which double-sided printing can be achieved, and also electrostatic spraying machines, although these machines do not yet function satisfactorily.

The present invention also overcomes the drawback of oxidation of that side to which no varnish is applied during a single-side coating process (especially in the case of copper) or contamination of said side in some other way such as to make it necessary to clean the other side of the plate when both sides are to be varnished. The task of cleaning the plate is difficult to carry out without negatively influencing the varnish applied to the other side of the plate. Such cleaning is normally necessary, even when both sides of the plate are initially carefully cleaned.

It should also be mentioned that plates that have been coated in accordance with the present invention can be placed on edge immediately after applying the coating, due to the viscosity of the varnish; this has not been possible with curtain-varnished circuit boards. It should also be mentioned that the holes in a plate will not become blocked, since the varnish is applied to a thickness of 5–100 μm. The varnish remains at the edge of the hole; meaning that development after exposure will be highly positive. There are no varnish residues which prevent soldering of the holes.

By applying varnish to both sides of the plate simultaneously, there is no risk that the highly sensitive first side of the plate will be damaged while hardening in the drying state as varnish is applied to the other side of said plate. The most suitable embodiment of the present invention is therefore the embodiment in which both sides are varnished simultaneously.

The invention will now be described in more detail with reference to a working example.

EXAMPLE

A printed circuit board provided with an etched conductor pattern and drilled, through-plated holes, was varnished with a photo-sensitive varnish on both sides thereof at 24° C., by passing the circuit board through two rubber rolls having a diameter of 70 mm and a hardness of 60° IRH. Varnish was applied continuously to the rolls by means of two applicator rolls. The varnish was applied to the rolls to a thickness of about 30 μm and the varnish had a viscosity of 2000±100 mPa.s. All rolls were driven at the same surface speed, about 15 m/min. The viscosity was measured with a Brookfield viscosimeter LVT, spindle 3.

The circuit board was passed once more through the roll nip, while the varnish was still wet, and was then placed in a rack to dry. The varnish now had a thickness of 2–10 μm over large pattern surfaces. If a thicker layer of varnish is desired, the circuit board is dried in air for about 5 minutes and then passed again through the roll nip, as before described. This results in a layer thickness over individual conductors of about 15 μm.

The circuit board was finally dried in an oven with good air exchange (for 15 minutes at 80° C.), after which it was judged to be sufficiently dry for irradiation in a vacuum frame, without sticking to the film.

I claim:

1. A method for applying a liquid varnish coating over a raised conductor pattern of a printed circuit board, the method comprising the steps of:
    (a) providing a roll press including an applicator roll and two nip rolls forming a roll nip for transferring liquid varnish onto a printed circuit board;
    (b) coating one of said nip rolls by transferring liquid varnish from said applicator roll to said one nip roll, the coating having a viscosity of at least 300 mPa.s, while continuously pumping a flow of liquid varnish onto the applicator roll in an amount of at least 1.5 times the rate at which the varnish is transferred by the nip rolls;
    (c) adjusting the thickness of the coating on said one nip roll by adjusting the thickness of said varnish on said applicator roll to between 5 and 100 μm; and
    (d) passing a printed circuit board through said roll nip and simultaneously transferring liquid varnish from said one nip roll to a side of said printed circuit board containing a raised conductive pattern, thereby forming a liquid varnish coating on said circuit board of between 5 and 100 μm.

2. A method according to claim 1, wherein the viscosity is up to 5000 mPa.s.

3. A method according to claim 1, wherein the viscosity is from 1000 to 4000 mPa.s.

4. A method according to claim 1, wherein the temperature is at least 15° C. and less than 60° C.

5. A method according to claim 1, wherein the thickness of the varnish on the applicator roll is at least 20 μm and less than 90 μm.

6. A method according to claim 1, wherein the thickness of the varnish on the applicator roll is at least 40 μm and less than 70 μm.

7. A method according to claim 1, wherein the varnish is a solder resist varnish.

8. A method according to claim 7, wherein the solder resist comprises a photopolymerizable varnish.

9. A method according to claim 1, wherein the thickness of the varnish film on the applicator roll is adjusted with a pressure roll or doctor blade.

10. A method according to claim 7, wherein the roll press has two applicator rolls for applying a varnish coating to each of said nip rolls, thereby coating both sides of said printed circuit board.

11. The method of claim 1, wherein the flow of varnish onto the applicator roll is at least 5 times the rate at which the varnish is applied to the printed circuit board.

12. The method of claim 1, wherein the flow of varnish onto the applicator roll is at least 10 times the rate at which the varnish is applied to the printed circuit board.

13. A method for applying a liquid varnish on a printed circuit board having a raised conductor pattern and plated through holes, comprising:
(a) providing a roll press having at least two roll pairs, each of said roll pairs comprising an applicator roll and another roll, said roll press being provided with a container for the varnish, a pumping means and piping capable of continuously pumping varnish onto the applicator rolls;
(b) adjusting the distance between the applicator roll and the other roll of the roll pair to provide a varnish film thickness between 5 μm and 100 μm, said distance being determined by the thickness of varnish to be applied to the printed circuit board;
(c) providing a varnish having a viscosity of at least 300 mPa.s and at temperature of at least 5° C. and less than 60° C.;
(d) applying a coating of varnish to the printed circuit board by passing the circuit board through the roll press while continuously pumping a flow of varnish onto the applicator rolls, said flow of varnish being in an amount at least 1.5 times the rate at which varnish is applied to the printed circuit board; and
(e) solidifying said varnish coating on the printed circuit board.

14. The method of claim 13, wherein said varnish comprises a photosensitive, solid resist varnish, which after solidifying is exposed and the solder mask pattern developed.

15. The method of claim 13, wherein the flow of varnish onto the applicator roll is at least 5 times the rate at which the varnish is applied to the printed circuit board.

16. The method of claim 15, wherein the flow of varnish onto the applicator roll is at least 10 times the rate at which the varnish is applied to the printed circuit board.

17. The method of claim 13, wherein the viscosity of the varnish is up to 5000 mPa.s.

18. The method of claim 17, wherein the viscosity of the varnish is the range of 1000–4000 mPa.s.

19. The method of claim 13, wherein the thickness of the varnish on the applicator roll is at least 20 μm and less than 90 μm.

20. The method of claim 13, wherein the thickness of the varnish on the applicator roll is at least 40 μm and less than 70 μm.

* * * * *